(12) United States Patent
Fabis

(10) Patent No.: US 6,211,463 B1
(45) Date of Patent: Apr. 3, 2001

(54) ELECTRONIC CIRCUIT PACKAGE WITH DIAMOND FILM HEAT CONDUCTOR

(75) Inventor: Philip M. Fabis, Medfield, MA (US)

(73) Assignee: Saint-Gobain Industrial Ceramics, Inc., Worcester, MA (US)

( * ) Notice: Subject to any disclaimer, the term of this patent is extended or adjusted under 35 U.S.C. 154(b) by 0 days.

(21) Appl. No.: 09/216,143

(22) Filed: Dec. 18, 1998

Related U.S. Application Data

(60) Provisional application No. 60/072,431, filed on Jan. 26, 1998.

(51) Int. Cl.[7] .................................................. H01L 23/02
(52) U.S. Cl. ..................... 174/52.5; 361/708; 361/720; 257/712; 257/690
(58) Field of Search ...................... 257/721, 712, 257/713, 698, 699, 708, 690; 174/52.6, 52.1, 52.5; 361/708, 720

(56) References Cited

U.S. PATENT DOCUMENTS

| | | | | |
|---|---|---|---|---|
| 4,227,036 | * | 10/1980 | Fitzgerald | 174/16 |
| 5,001,299 | * | 3/1991 | Hingorany | 174/52.4 |
| 5,198,885 | * | 3/1993 | Ibrahim | 257/701 |
| 5,371,654 | * | 12/1994 | Beaman et al. | 361/744 |

* cited by examiner

*Primary Examiner*—Dean A. Reichard
*Assistant Examiner*—Hung V Ngo
(74) *Attorney, Agent, or Firm*—Volker R. Ulbrich

(57) ABSTRACT

An electronic circuit device package of the type having a metal laminate base flange of molybdenum clad with copper on both faces has a CVD diamond film substrate inlaid in a well in the bottom of the base flange so that it is flush with the base flange surface. An opening in the opposite side of the base flange forms a chamber with the diamond as a floor to which the device may be bonded in intimate contact with the diamond substrate. The edges of the diamond are brazed with a gold-indium braze in intimate thermal contact with a shoulder of the well to maximize heat conduction from the edges of the diamond into the base flange. The base flange may be fastened to the flat surface of a heat sink member with the diamond in intimate thermal contact with the heat sink member.

14 Claims, 3 Drawing Sheets

ELECTRONIC CIRCUIT PACKAGE WITH
DIAMOND FILM HEAT CONDUCTOR

This appln claims the benefit of Provisional No. 60/072,431 filed Jan. 26, 1998.

FIELD OF THE INVENTION

The invention relates generally to packages for electronic circuits and in particular to such packages which make use of diamond film for conducting heat from the device to the outside of the package.

BACKGROUND OF THE INVENTION

Electronic devices are typically housed in a "package". The package is designed to provide the device protection from environmental factors, such as moisture. It is also designed for convenient electrical interconnection and for conduction of heat generated by the circuit to the outside of the package, where it may be removed by various means. There are many different types of packages commercially available to the manufacturers of electronic circuits. To some extent the wide use of certain types has given them the reputation as a "standard" design geometry identified by a designation recognized in the industry through validation by trade organizations, such as the IEEE (Institute of Electronic and Electrical Engineers).

Heat removal from circuit devices in packages has become increasingly challenging as their power densities have increased. For example, large scale integrated circuits include ever larger numbers of active elements and operate at ever higher speeds, which requires more power. Power amplifiers have been reduced in size, to that they have higher power densities. More effective heat removal has been accomplished by the incorporation into the package design of materials which have a high heat conductivity, such as copper. Usually, the copper is in the form of a substrate of the package, and the circuit device is mounted directly to it with a suitable bonding agent. In some cases the circuit device cannot be mounted directly on an electrically conducting member because spurious noise in its signal would arise due to capacitive coupling to the substrate. In that case either the conductive substrate must be covered with an electrically insulating layer before the circuit device is attached, or the substrate must itself be made of an electrically insulating, thermally conductive material. Packages of this general type are described, for example, in U.S. Pat. Nos. 5,065,281 and 5,109,268.

While there are a number of materials, such as aluminum nitride, beryllium oxide, aluminum oxide, and silicon nitride, which are electrically insulating and also effective conductors of heat, by far the most outstanding material in this category is diamond. In particular, diamond film can be made by CVD (chemical vapor deposition) in wafer form suitable for use as a substrate material. It has a very high electrical resistivity and is about three to five times as effective in conducting heat as is even copper, the best of the metals in this regard.

The incorporation of diamond film into a package for heat removal involves a number of difficulties. Among these is that the CTE (coefficient of thermal expansion) of diamond is much lower than that of the metals typically used in packages. This can lead to extreme stresses and eventual mechanical failure of the package itself or of the circuit device housed by it. Attempts to alleviate mismatching of the CTE often lead to multi-layered structures in which the heat conductivity of the diamond material is not used to full advantage due to the thermal impedances introduced by intervening interfaces or the external geometry of the package becomes altered, so that it can no longer be used in the same way for all applications. Such a change in geometry is often unacceptable to the circuit device manufacturers who use the package because it requires specialized assembly equipment and processes.

There is a need for a circuit package which successfully incorporates diamond film into a circuit device package for heat removal while avoiding damaging thermal mismatch with other materials attached to it and minimizing any detraction in its performance for removing heat from the circuit device to the outside of the package.

SUMMARY OF THE INVENTION

In accordance with the novel invention as described herein, diamond is incorporated in a package in such a manner that the circuit device may be thermally coupled directly to the surface of it inside the package, while heat may be removed directly from a surface of the diamond outside the package. This structure provides a rapid thermal response because of the low heat capacity of the diamond, while eliminating all other interfaces between the circuit device and the outside diamond surface to maximize thermal conductivity. As a result of the highly effective heat removal of this structure, the operating temperature of the circuit device can be stabilized at a sufficiently low temperature that CTE mismatch problems between the circuit device and the diamond are avoided.

DETAILED DESCRIPTION

Figure 1:
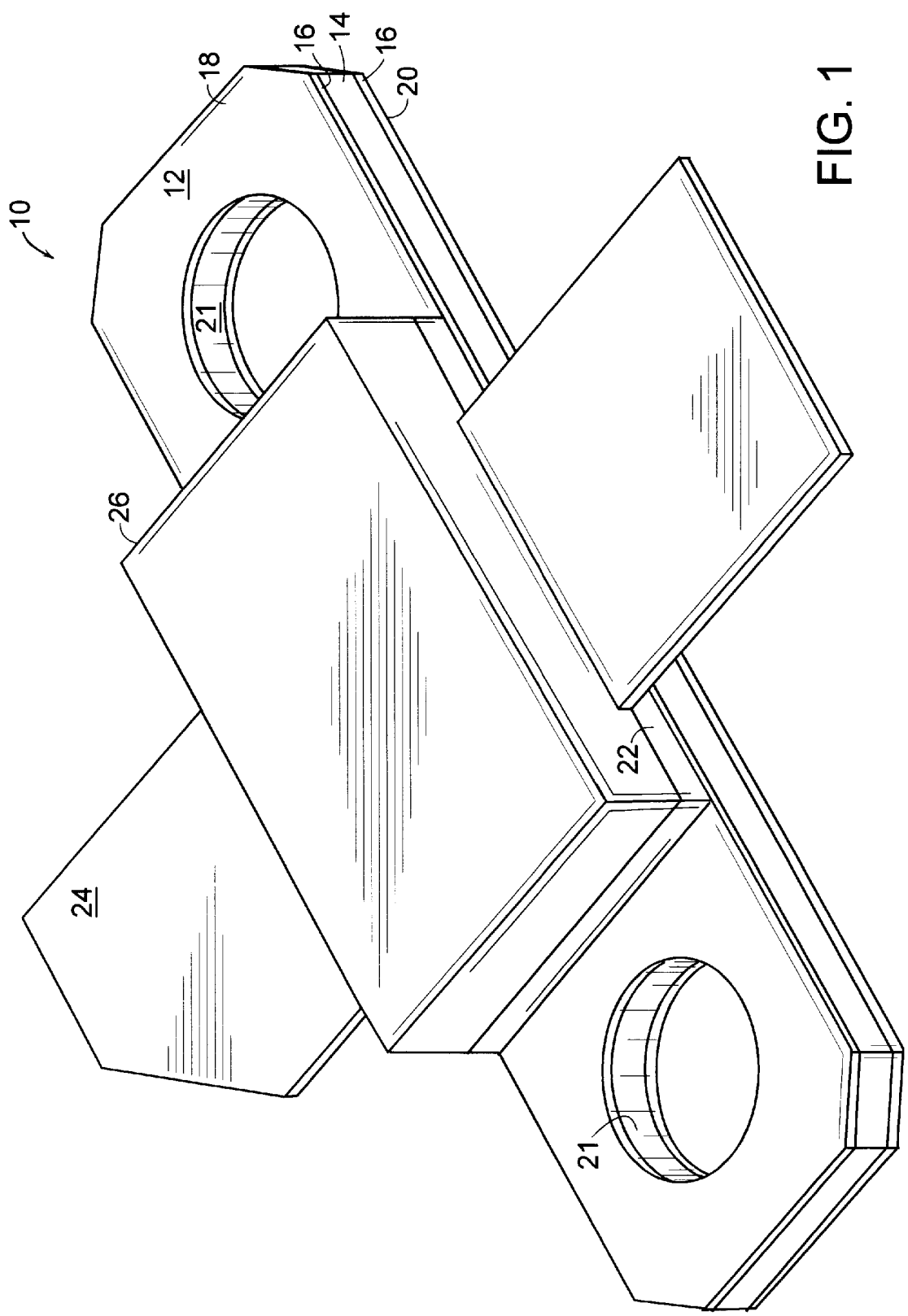
FIG. 1 is an elevated perspective view of an electronic circuit device package in accordance with one embodiment of the present invention in its sealed condition.

In accordance with a preferred embodiment of the present invention, a standard geometry circuit device package 10 as shown in FIGS. 1–4 which is identified in the industry by the designation RF701 and manufactured, for example, by the Brush Wellman Engineered Materials Company of Newburyport, Mass., is adapted to incorporate a CVD diamond film heat conducting element. This package is especially suitable for housing RF (radio frequency) devices which have a relatively high power output.

The main supporting structure of the package 10 is a metal laminate base flange 12 which is adapted to be fastened to a heat sink member (not shown). The base flange 12 is a laminate which includes a core 14 of molybdenum about 24 mils thick bonded by a heat diffusion process directly to a copper cladding 16 about 8 mils thick over both its top face 18 and its bottom face 20. Bonded to the copper of the top face 18 is an alumina frame 22 to which there are attached on opposite top sides two copper power leads 24 which pass from the outside to the inside of the package 10. A cap 26 hermetically seals the package 10.

The base flange 12 is a modified version of what is normally CuW (copper-tungsten) base flange for this type of package. Normally, such a flange is entirely of CuW. It is designed to have its bottom face 20 firmly fastened to the flat surface of a heat sink member, such as a metal "slug", by means of screws which extend through two fastening holes 21. The present, modified version of the base flange 12 is made as a laminate because the molybdenum core has a CTE which closely matches that of the silicon circuit device to be housed in the package. The copper cladding is provided to permit assembly of the package components in the same manner as if the base flange 12 were copper-tungsten, thus eliminating the need for developing specialized machinery and procedures for this process.

Figure 2:
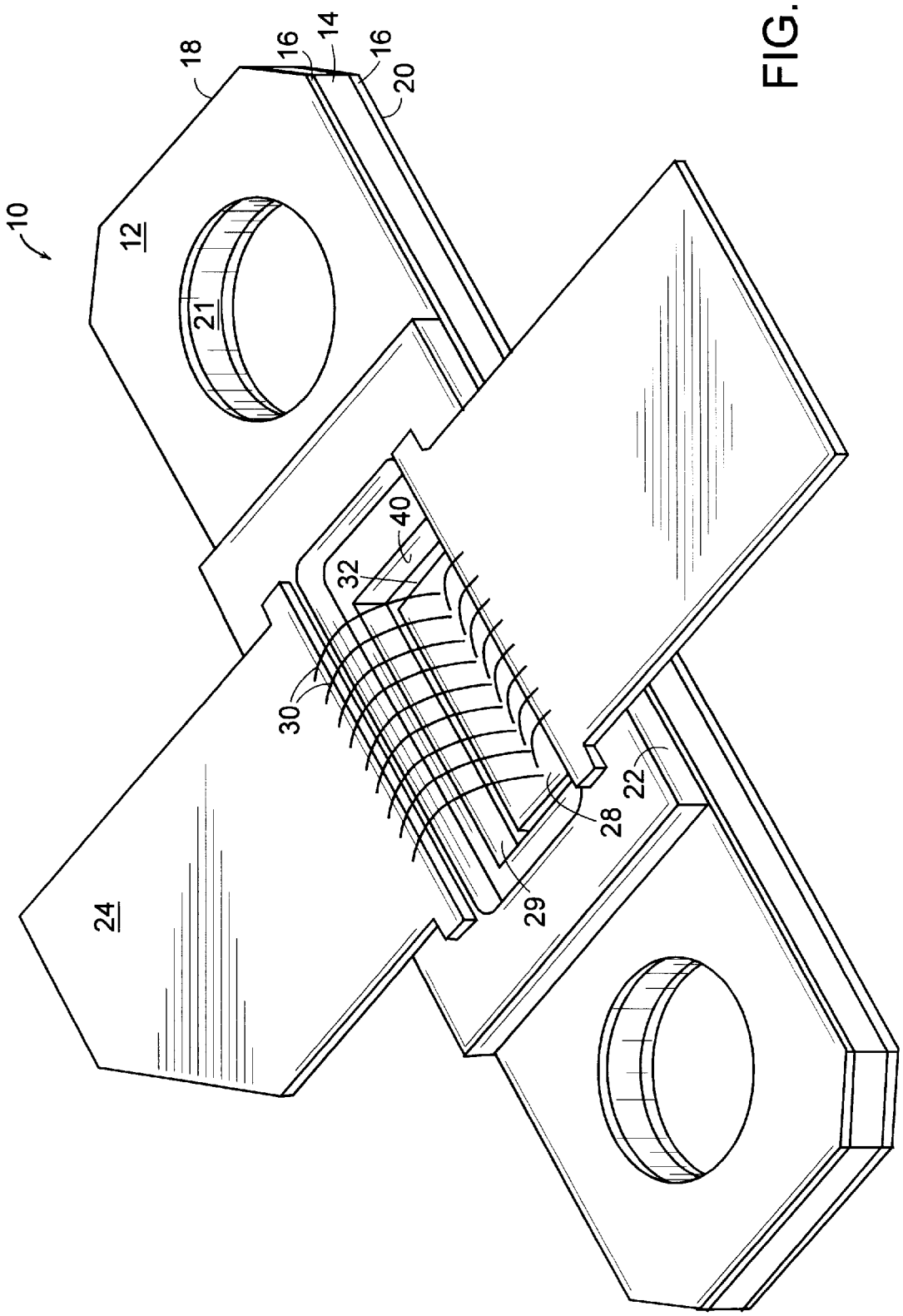
FIG. 2 shows the package of FIG. 1 with its cap removed to expose its inner chamber.

FIG. 2 shows the package of FIG. 1 with the cap 26 removed to reveal a silicon circuit device 28 disposed in a chamber 29 formed by an opening 40 through the base flange 12. The device 28 is electrically connected to the two copper power leads 24 by means of a plurality of bonding wires 30 and is attached by a thermally-conductive bonding agent to a heat conducting floor member, or substrate 32 made of diamond film about 350 micrometers thick. The diamond substrate 32 to which the device 28 is attached is metallized over its entire surface with first a titanium layer about 1000 Angstroms thick, then a layer of platinum about 2000 Angstroms thick, and then a layer of gold about 3.75 microns thick. The attachment is carried out by heating the package and pressing the device 28 against the metallizing 38 while vibrating it horizontally to form a gold-silicon eutectic interface and is a known process. Such an interface provides an intimate thermal and electrical contact. The bottom of the device 28 has a base electrical lead which becomes connected to the base flange via the metallizing 38.

Figures 3, 4:
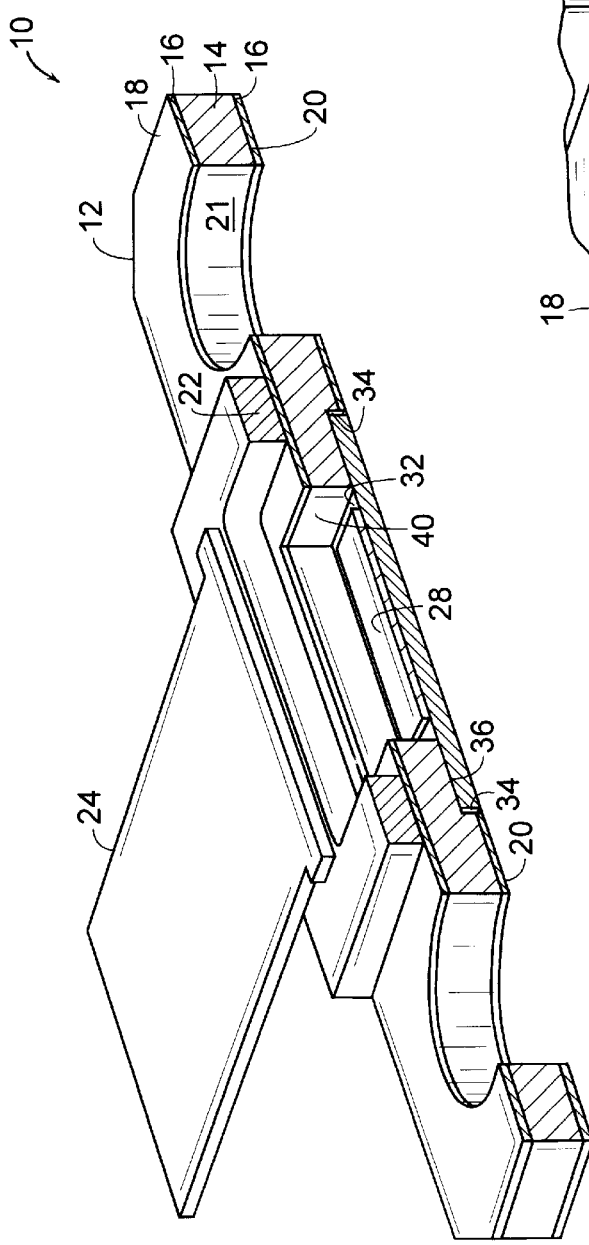
FIG. 3 is a sectioned view of the package of FIGS. 1 and 2 without the circuit device and connecting wires.
FIG. 4 is an enlarged, sectional view of a portion of the section of FIG. 3 showing details of a brazed joint.

The FIG. 3 shows the package 10 in section, with the cap 26, device 28, and bonding wires 30 removed. It is seen that the diamond substrate 32 is inlaid into a shallow well 34 formed in the bottom surface of the base flange 12, so that it abuts a shoulder 36. As is shown in greater detail in FIG. 4, the substrate 32 is brazed to the shoulder 36 by means of a gold-indium braze 37 which is 81 weight % gold and 19 weight % indium and is sufficiently malleable to accommodate the small degree of CTE mismatch between the diamond substrate 32 and the molybdenum of the base flange 12. The well 34 is made just deep enough so that the diamond substrate 32 fits into it to become flush with the bottom surface 20 of the base flange 12. When the base flange is fastened to a heat sink member (not shown), with an appropriate thermal interface compound, such as a thermal grease (e.g. a wax loaded with finely-divided thermal conductor, such as diamond or boron nitride), the diamond substrate 32 makes optimum intimate contact with the heat sink for maximizing heat transfer.

In practice, the thickness of the diamond is chosen to suit the needs of the circuit in terms of how much heat spreading and how much total heat conduction rate is required. The well 34 is then dimensioned to accommodate those dimensions of the diamond substrate 32. The calculations for such design parameters are known to those in the art.

General Considerations

While in the embodiment described above, the core of the base flange is molybdenum and the substrate is diamond, the invention is applicable to other choices of these materials and need not be a laminate at all. For example, the base flange could be entirely of CuW, entirely of tungsten, or entirely of aluminum silicon carbide. However, for base flange materials which present a greater CTE mismatch problem for the device being housed, it will be necessary to limit more severely the temperature excursions of the device.

The attachment of the substrate to the shoulder of the base flange can be by other bonding methods, depending upon their suitability otherwise for the particular structure involved. The braze 37 used in the package 10 forms a particularly intimate thermal contact between the members and has excellent mechanical integrity. This leaves the substrate with not only a very high heat flux passing through its thickness to the outside, but also a very high heat flux passing to the base flange member from its edges where they are brazed. In some applications, the heat transfer from the edges may be less important. In that case other bonding agents, such as solders or epoxies, may be sufficient. An alternative braze which could be used in place of the gold-indium combination would be one of 20 weight % copper and 80 weight % silver. In that case the metallizing would be replaced by one which has a first layer of titanium about 1000 Angstroms thick, then a layer of tungsten about 2000 Angstroms thick, then a layer of platinum about 2000 Angstroms thick, and finally a layer of nickel about 2 microns thick.

For situations in which removal of heat from the edges of the diamond substrate is not considered important, the means of attaching the substrate to the base flange is less important, and can be accomplished, for example, without any metallizing and by simply a suitable organic adhesive. Likewise, where the heat removal from the device to the diamond substrate need not be maximized, there may be used other means of fastening the device to the substrate which do not require metallizing.

The details of the leads and how they are held in place on the package and connected to the housed device are not considered a part of the invention and may be a matter of choice. Likewise, the manner in which the housing is sealed is a matter of choice. It is of key importance, however, that the device be directly thermally coupled to one side of the diamond substrate and that the diamond substrate be directly thermally coupled to a heat removal means. By "directly thermally coupled" is meant that the only intervening material, if any, between members so coupled is a thermal coupling agent which is viscously deformed by pressure between the members and has a resulting thickness less than 10 microns. It does not include a structure in which a solid polyimide or other film of about 25 microns or more in thickness is interposed between the members. It does include the use of a settable adhesive, solder, braze, or thermal grease.

If the package is housing a device which does not require attachment to a conductive substrate for providing an electrical lead connection, then the diamond substrate can have metallizing on its inside surface only where needed for brazing and for attaching the device. On its outside surface, it then needs to have metallizing only as required for providing a good thermal coupling to whatever means are used for removing the heat conducted to that outside surface.

Rather than be inset into a shallow well, as is the case for the diamond substrate 32 of the package 10, the diamond substate could also be simply be attached to the bottom surface of the base flange, overlapping the edge of an opening in the flange for forming a housing chamber, so long as this suits the needs of the heat removal means for removing heat from the outside surface of the diamond. For example, in such a case it may be necessary to provide spacers of the same thickness as the diamond substrate under the holes for fastening the package to a heat sink in order to prevent bending of the base flange as a result of a cantilever effect from the diamond substrate being raised above the bottom surface of the base flange.

The invention can be adapted to a wide variety of packages which feature a base flange which is designed to act as a heat removal member for the housed device. the adaptation involves removing at least that portion of the base flange which would support the device and replacing it with diamond film substrate of a thickness which meets the demands of thermal management of the device. In addition, the diamond film substrate should be located so that it properly couples the output heat of the package to heat removal means. If the package is to be mounted to a solid heat sink, it may be necessary to have the substrate flush with the lower surface of the base flange to be mounted. If the heat removal is by fluid flow or liquid spray, this may not be necessary.

What is claimed is:

1. A package for housing an electronic circuit device, comprising:

a molybdenum base flange with a cladding comprising copper adapted to be fastened to a heat removal means, the base flange having a top face and a bottom face;

an opening between the top face and bottom face of the base flange;

a diamond substrate having a top and a bottom major surface disposed across the opening and fastened to the molybdenum of the base flange without intervening cladding.

2. The package in accordance with claim 1 wherein the opening of the base flange has a rim at its bottom face which includes a recessed shoulder having a depth from the bottom face of the base flange.

3. The package in accordance with claim 2 wherein the diamond substrate is inlaid on the shoulder.

4. The package in accordance with claim 3 wherein the bottom major surface of the diamond substrate is flush with the bottom face of the base flange.

5. The package in accordance with claim 4 wherein a bonding agent is provided between the top major surface of the diamond substrate and the surface of the shoulder.

6. The package in accordance with claim 5 wherein the bonding agent is a braze.

7. The package in accordance with claim 6 wherein the braze is a gold-indium braze.

8. The package in accordance with claim 7 wherein the braze is 81% by weight of gold and 19% by weight of indium.

9. The package in accordance with claim 1 wherein the diamond substrate is metallized on its upper major surface at least over an area in which an electronic circuit device is to be attached.

10. The package in accordance with claim 9 wherein the metallizing includes a first layer of titanium on the diamond.

11. The package in accordance with claim 10 wherein the titanium layer is about 1000 Angstrons thick.

12. The package in accordance with claim 11 wherein the titanium layer is covered with a layer of platinum.

13. The package in accordance with claim 12 wherein the platinum layer is about 2000 Angstroms thick.

14. The package in accordance with claim 13 wherein the platinum layer is covered with a layer of gold.

* * * * *